United States Patent
Ibaragi et al.

(10) Patent No.: US 11,736,089 B2
(45) Date of Patent: Aug. 22, 2023

(54) QUARTZ CRYSTAL RESONATOR UNIT AND METHOD OF MANUFACTURING THE SAME

(71) Applicant: Murata Manufacturing Co., Ltd., Nagaokakyo (JP)

(72) Inventors: Hiroshi Ibaragi, Nagaokakyo (JP); Hiroaki Kaida, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 992 days.

(21) Appl. No.: 16/292,871

(22) Filed: Mar. 5, 2019

(65) Prior Publication Data

US 2019/0245512 A1   Aug. 8, 2019

Related U.S. Application Data

(63) Continuation of application No. PCT/JP2017/032165, filed on Sep. 6, 2017.

(30) Foreign Application Priority Data

Sep. 8, 2016   (JP) ................. 2016-175233

(51) Int. Cl.
*H03H 9/19*   (2006.01)
*H03H 3/02*   (2006.01)
(Continued)

(52) U.S. Cl.
CPC ............ *H03H 9/19* (2013.01); *H03H 3/02* (2013.01); *H03H 9/02* (2013.01);
(Continued)

(58) Field of Classification Search
CPC .. H03H 9/19; H03H 3/02; H03H 9/02; H03H 9/02086; H03H 9/0509; H03H 9/1021
(Continued)

(56) References Cited

U.S. PATENT DOCUMENTS 7,932,786 B2 * 4/2011 Moriya ................ H03H 9/0547
361/728

FOREIGN PATENT DOCUMENTS

JP   2001144571 A   5/2001
JP   2011009808 A   1/2011
(Continued)

OTHER PUBLICATIONS

International Search Report issued in PCT/JP2017/032165, dated Oct. 31, 2017.
(Continued)

*Primary Examiner* — Richard Tan
(74) *Attorney, Agent, or Firm* — ArentFox Schiff LLP

(57) ABSTRACT

A quartz crystal resonator unit includes a quartz crystal resonator that includes a quartz crystal blank. A pair of excitation electrodes are disposed on opposed main surfaces of the quartz crystal blank so as to face each other. A pair of connection electrodes are electrically connected to respective ones of the pair of excitation electrodes. A base member has a surface on which the quartz crystal resonator is mounted. A lid member is joined to the surface of the base member via a joining member. The quartz crystal resonator is accommodated in an inner space defined by the lid member and the base member on the surface of the base member. Parts of the joining member that cover protruding portions are in contact with a side wall of the lid member so as to restrain movement of the lid member when seen in a plan view in a direction normal to the surface of the base member.

23 Claims, 5 Drawing Sheets

(51) Int. Cl.
   *H03H 9/05*   (2006.01)
   *H03H 9/02*   (2006.01)
   *H03H 9/10*   (2006.01)

(52) U.S. Cl.
   CPC ...... *H03H 9/02086* (2013.01); *H03H 9/0509* (2013.01); *H03H 9/1021* (2013.01)

(58) Field of Classification Search
   USPC .......................................................... 310/348
   See application file for complete search history.

(56) References Cited

FOREIGN PATENT DOCUMENTS

| | | | |
|---|---|---|---|
| JP | 2013145964 A | | 7/2013 |
| WO | WO2016190090 | * | 1/2016 |
| WO | 2016084425 A1 | | 6/2016 |

OTHER PUBLICATIONS

Written Opinion of the International Searching Authority issued in PCT/JP2017/032165, dated Oct. 31, 2017.

* cited by examiner

QUARTZ CRYSTAL RESONATOR UNIT AND METHOD OF MANUFACTURING THE SAME

CROSS REFERENCE TO RELATED APPLICATIONS

The present application is a continuation of International application No. PCT/JP2017/032165, filed Sep. 6, 2017, which claims priority to Japanese Patent Application No. 2016-175233, filed Sep. 8, 2016, the entire contents of each of which are incorporated herein by reference.

BACKGROUND OF THE INVENTION

The present invention relates to a quartz crystal resonator unit and a method of manufacturing a quartz crystal resonator unit. In particular, the present invention relates to a quartz crystal resonator unit that includes a quartz crystal resonator, a base member, and a lid member; and a method of manufacturing a quartz crystal resonator.

Quartz crystal resonator units are widely used as a signal source of a reference signal used for oscillation devices and bandpass filters. A quartz crystal resonator unit includes, for example, a quartz crystal resonator, a base member on which the quartz crystal resonator is mounted, and a lid member that is joined to the base member in such a way that the quartz crystal resonator is accommodated in an inner space. In this case, if the accuracy of the joining position of the lid member is low, it may not be possible to obtain a desirable frequency of the quartz crystal resonator unit. Therefore, for example, Japanese Unexamined Patent Application Publication No. 2011-9808 (Patent Document 1) discloses a structure in which protrusions are formed on a cover having a recessed shape and the positions of the protrusions are adjusted to holes formed in a flat-plate-shaped base. Japanese Unexamined Patent Application Publication No. 2013-145964 (Patent Document 2) discloses a structure of a ceramic base plate on which protruding portions are formed at positions that contact an inner wall of a metal cover.

However, with the structure described in Patent Document 1, hermeticity may be impaired if the accuracy of the positions of the holes and the protrusions is low. Also with the structure described in Patent Document 2, because positioning is performed, when seen in a plan view in a direction normal to the surface of the ceramic base plate, by bringing the protruding portions into direct contact with the inner wall of the recessed cover, hermeticity may be impaired if the accuracy of the positions of the protruding portions is low. Moreover, regarding Patent Document 2, because it is necessary to form the protruding portions at positions where a sealing portion of the metal cover is not present, it may be necessary to form the protruding portions with high accuracy.

The present invention has been made in consideration of the above circumstances, and an object thereof is to provide a quartz crystal resonator unit and a method of manufacturing a quartz crystal resonator unit with which the hermeticity of a quartz crystal resonator can be improved and the joining strength between a lid member and a base member can be improved.

BRIEF DESCRIPTION OF THE INVENTION

In one aspect, the invention in directed towards a quartz crystal resonator unit comprising:
a base member including a surface and two protruding portions on the surface;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the protruding portions, the lid member and the base member defining an inner space that accommodates the quartz crystal resonator, at least a portion of the joining member covering the protruding portions are in contact with the side wall of the lid member so as to restrain movement of the lid member when seen in a plan view in a direction normal to the surface of the base member.

The side wall preferably has an inner surface facing the inner space and an opposed outer surface. The parts of the joining member that cover the protruding portions are in contact with either the inner or outer surface side of the side wall.

The lid member preferably has a rectangular shape when seen in a plan view in the direction normal to the surface of the base member and the protruding portions are disposed so as to correspond to two opposite corners of the rectangular shape of the lid member.

The base member preferably includes a base body that is a first sintered material and the protruding portions are made of a second sintered material whose sintering shrinkage ratio is smaller than a sintering shrinkage ratio of the base body.

The protruding portions are preferably disposed on via-electrodes of the base member.

The base member can include an outer electrode. In such a case, it is preferred that the protruding portions are made of an electroconductive material and are electrically connected to the outer electrode.

The invention is also directed toward a method of manufacturing a quartz crystal resonator unit, comprising:
mounting a quartz crystal resonator on a surface of a base member including two protruding portions on the surface, the quartz crystal resonator including a quartz crystal blank, a pair of excitation electrodes that are disposed on respective opposed main surfaces of the quartz crystal blank so as to face each other with the quartz crystal blank located there between, and a pair of connection electrodes disposed on the quartz crystal blank and electrically connected to respective ones of the pair of excitation electrodes; and
joining a lid member having a side wall that extends toward the surface of the base member to the surface of the base member via a joining member in such a way that:
the quartz crystal resonator is accommodated in an inner space defined by the joined base member and lid;
the joining member covers the protruding portions and
at least a portion of the joining member that covers at least a portion of the protruding portions are brought into contact with the side wall of the lid member and restrain movement of the lid member when seen in a plan view in a direction normal to the surface of the base member the lid member.

The base member preferably includes a base body that is a first sintered material. In such a case, it is preferred that the method further comprises:
forming a hole or a recessed portion in the base body;
placing a second sintered material, whose sintering shrinkage ratio is smaller than a sintering shrinkage ratio of the base body, in the hole or the recessed portion, and forming the protruding portions from the second sintered material by sintering the base member.

It is also preferred that the method produces a quartz crystal unit having the features noted above.

With the structure described above, because the joining member, which covers the protruding portions, is brought into contact with the side wall of the lid member, joining strength can be improved. Moreover, because displacement of the position of the lid member can be suppressed, the hermeticity of the quartz crystal resonator can be improved.

With the present invention, it may or can provide a quartz crystal resonator unit and a method of manufacturing a quartz crystal resonator unit with which the hermeticity of a quartz crystal resonator can be improved and the joining strength between a lid member and a base member can be improved.

DESCRIPTION OF PREFERRED EMBODIMENTS

Hereinafter, embodiments of the present invention will be described. In the following description related to the drawings, elements that are the same as or similar to each other will be denoted by the same or similar numerals. The drawings are exemplary, the dimensions and shapes of elements are schematic, and the technical scope of the present invention is not limited to the embodiments.

First Embodiment

Figure 1:
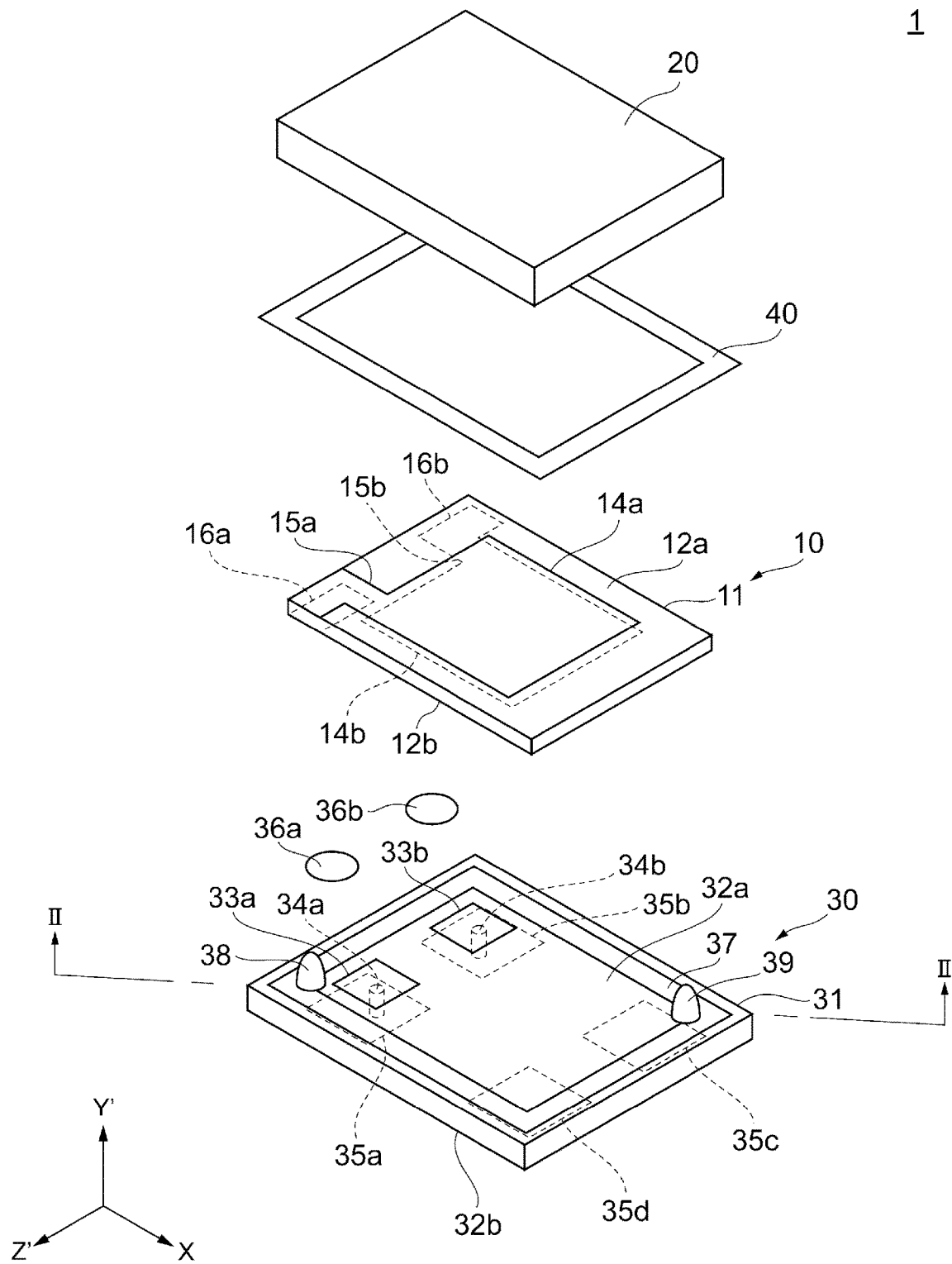
FIG. 1 is an exploded perspective view of a quartz crystal resonator unit according to a first embodiment of the present invention.
Figure 2:
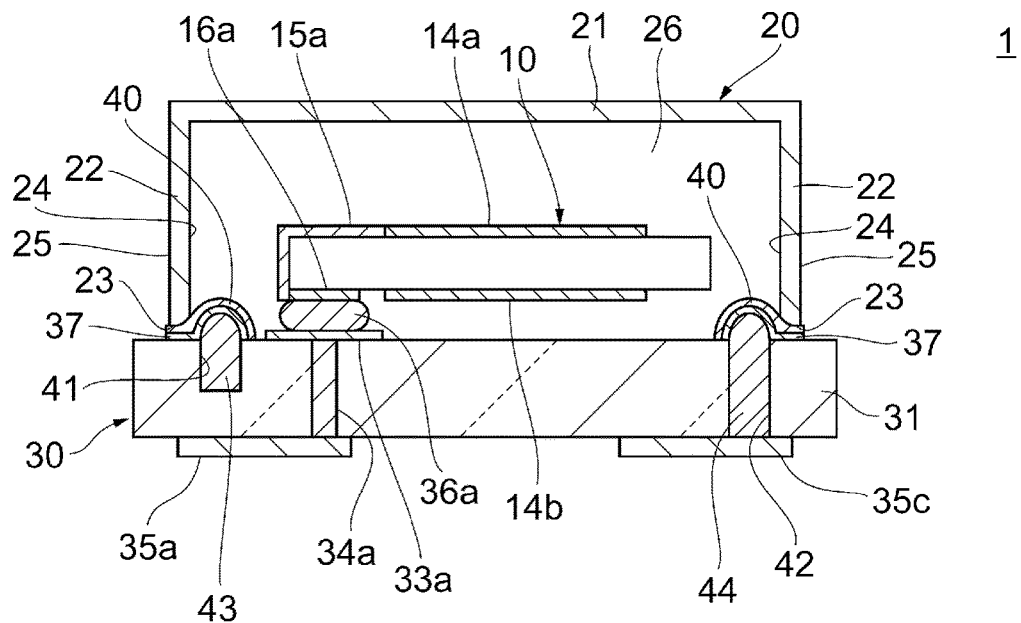
FIG. 2 is a sectional view taken along line of FIG. 1.
Figure 3:
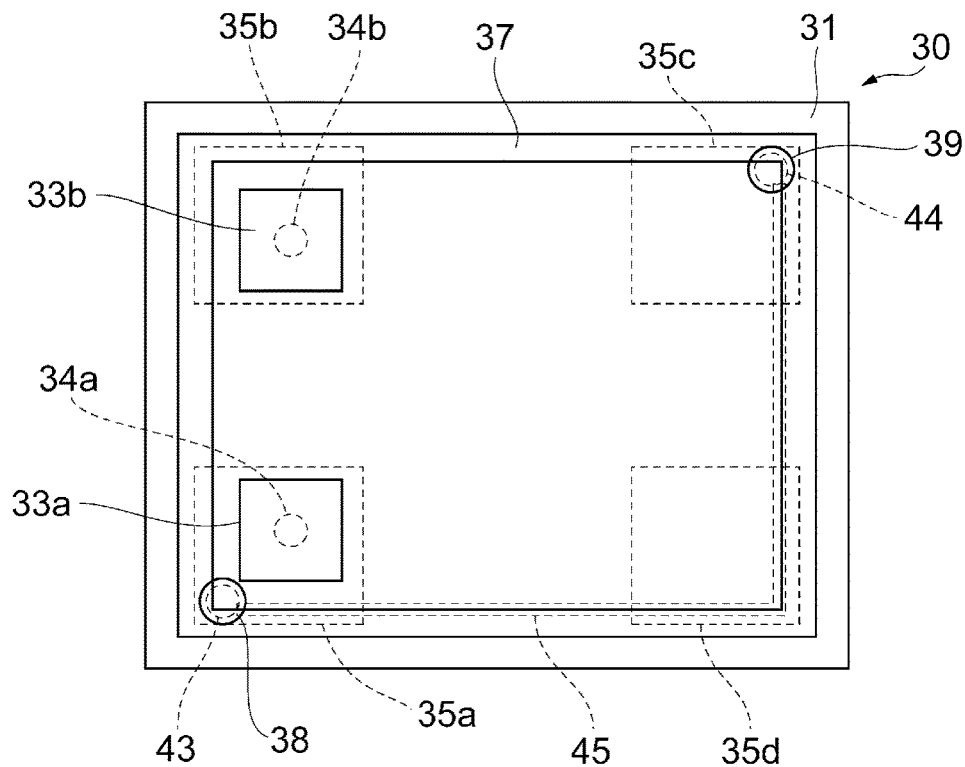
FIG. 3 is a plan view of a base member shown in FIG. 1.

Referring to FIGS. 1 to 3, a quartz crystal resonator unit according to a first embodiment of the present invention will be described.

As illustrated in FIG. 1, a quartz crystal resonator unit 1 according to the present embodiment includes a quartz crystal resonator 10, a lid member 20, and a base member 30. The lid member 20 and the base member 30 cooperate to define a recess which accommodates (houses) the quartz crystal resonator 10. In the example illustrated in FIG. 1, the lid member 20 has a recessed shape, and the base member 30 has a flat plate-like shape.

The quartz crystal resonator 10 includes an AT-cut quartz crystal blank 11. The AT-cut quartz crystal blank 11 is cut in such a way that, when the X-axis, the Y-axis, and the Z-axis are the crystallographic axes of a synthetic quartz crystal and the Y'-axis and the Z'-axis are respectively axes that are obtained by rotating the Y-axis and the Z-axis around the X-axis by 35 degrees 15 minutes±1 minute 30 seconds in a direction from the Y-axis toward the Z-axis, the quartz crystal element has a main surface that is parallel to a plane defined by the X-axis and the Z'-axis (hereinafter, referred to as "XZ'-plane", and the same applies to planes defined by the other axes). The quartz crystal blank 11 has a first main surface 12a and a second main surface 12b, which are parallel to the XZ'-plane and are spaced apart and face one another.

The quartz crystal blank 11, which is preferably an AT-cut quartz crystal blank, has long sides parallel to the X-axis direction, short sides parallel to the Z'-axis direction, and sides in a thickness direction parallel to the Y'-axis direction. The quartz crystal blank 11 has a rectangular shape in the XZ'-plane.

A quartz crystal resonator using an AT-cut quartz crystal element has very high frequency stability in a wide temperature range, has high durability, and can be manufactured at low cost. An AT-cut quartz crystal resonator uses a thickness shear vibration mode as main vibration.

In the present embodiment, the quartz crystal blank 11 has a flat plate-like shape. The first main surface 12a and the second main surface 12b each include a flat surface.

The quartz crystal resonator 10 includes a first excitation electrode 14a and a second excitation electrode 14b, which constitute a pair of electrodes. The first excitation electrode 14a is disposed on the first main surface 12a. The second excitation electrode 14b is disposed on the second main surface 12b. The first and second excitation electrodes 14a and 14b face each other in a region including the centers of the main surfaces 12a, 12b with the quartz crystal blank 11 therebetween. The first excitation electrode 14a and the second excitation electrode 14b are disposed in such a way that substantially the entireties thereof overlap as viewed in the XZ'-plane.

The first excitation electrode 14a and the second excitation electrode 14b each have long sides parallel to the X-axis direction, short sides parallel to the Z'-axis direction, and a thickness parallel to the Y'-axis direction. In the example illustrated in FIG. 1, in the XZ'-plane, the long sides of the first excitation electrode 14a and the second excitation electrode 14b are parallel to the long sides of the quartz crystal blank 11. Likewise, the short sides of the first excitation electrode 14a and the second excitation electrode 14b are parallel to the short sides of the quartz crystal blank 11. The long sides of the first excitation electrode 14a and the second excitation electrode 14b are separated from the long sides of a vibration portion 17, and the short sides of the first excitation electrode 14a and the second excitation electrode 14b are separated from the short sides of the vibration portion 17.

The quartz crystal resonator 10 includes extension electrodes 15a and 15b and connection electrodes 16a and 16b. The connection electrode 16a is electrically connected to the first excitation electrode 14a via the extension electrode 15a. The connection electrode 16b is electrically connected to the second excitation electrode 14b via the extension electrode 15b. The connection electrodes 16a and 16b are terminals for electrical connection with the base member 30. Both connection electrodes 16a and 16b are disposed on the second main surface 12b of the quartz crystal blank 11 and are arranged near a short side of the quartz crystal blank 11 on the negative Z' side in the short-side direction.

The extension electrode 15a electrically connects the first excitation electrode 14a and the connection electrode 16a. To be specific, the extension electrode 15a extends on the first main surface 12a in the negative-Z'-and-negative-X direction from the first excitation electrode 14a, extends from the first main surface 12a along the side surfaces of the quartz crystal blank 11 to the second main surface 12b, and is electrically connected to the connection electrode 16a on the second main surface 12b. The extension electrode 15b electrically connects the second excitation electrode 14b and the connection electrode 16b. To be specific, the extension electrode 15b extends on the second main surface 12b in the negative-Z'-and-positive-X direction from the second excitation electrode 14b, and is electrically connected to the connection electrode 16b on the second main surface 12b. By extending the extension electrodes 15a and 15b in this way, the connection electrodes 16a and 16b, which are electrically connected the first and second excitation electrodes 14a and 14b, respectively disposed on opposite main surfaces 12a and 12b, can be disposed only on the second main surface 12b.

The connection electrodes 16a and 16b are electrically connected to electrodes of the base member 30 via electroconductive holding members 36a and 36b. The electroconductive holding members 36a and 36b are preferably formed by thermally curing an electroconductive adhesive.

The material of the first and second excitation electrodes 14a and 14b, the extension electrodes 15a and 15b, and the connection electrodes 16a and 16b is not particularly limited. For example, the material may include a chromium (Cr) layer as an underlying layer and a gold (Au) layer on the surface of the chromium layer.

The lid member 20 is joined to the base member 30, and thereby accommodates the quartz crystal resonator 10 in an inner space 26. The lid member 20 has an inner surface 24 and an outer surface 25, and has a recessed shape that is open toward the first main surface 32a of the base member 30.

As best shown in FIG. 2, the lid member 20 includes a top panel 21 that faces the first main surface 32a of the base member 30, and a side wall 22 that is connected to an outer edge of the top panel 21 and extends in a direction normal to a main surface of the top panel 21. The lid member 20 has a rectangular shape when seen in a plan view in a direction normal to the main surface of the top panel 21. The lid member 20 has, for example, a long-side direction in which long sides parallel to the X-axis direction extend, a short-side direction in which short sides parallel to the Z'-axis direction extend, and a height direction parallel to the Y'-axis direction. The lid member 20 has a facing surface 23, which faces the first main surface 32a of the base member 30, at the opening edge of the recessed shape. The facing surface 23 extends in a frame-like shape so as to surround the periphery of the quartz crystal resonator 10.

The material of the lid member 20 is not particularly limited. For example, the material is an electroconductive material such as a metal. In this case, it is possible to additionally provide the lid member 20 with a shielding function by electrically connecting the lid member 20 to a ground potential. For example, the lid member 20 is made of an alloy that includes iron (Fe) and nickel (Ni) (such as 42 alloy). A gold (Au) layer or the like, for preventing oxidation and the like, may be formed on the outermost surface of the lid member 20.

Alternatively, the lid member 20 may be made of an insulating material or may have a composite structure made of an electroconductive material and an insulating material.

The base member 30 excitably supports the quartz crystal resonator 10. To be specific, the quartz crystal resonator 10 is excitably held on the first main surface 32a of the base member 30 via the electroconductive holding members 36a and 36b.

The base member 30 has a flat plate-like shape. The base member 30 has a long-side direction in which long sides parallel to the X-axis direction extend, a short-side direction in which short sides parallel to the Z'-axis direction extend, and a thickness direction in which a thickness parallel to the Y'-axis direction extends.

The base member 30 includes a base body 31. The base body 31 has the first main surface 32a and a second main surface 32b, which face each other and which are parallel to the XZ'-plane. The base body 31 is formed, for example, of a first sintered material such as insulating ceramic (alumina). In this case, a plurality of insulating ceramic sheets may be stacked and sintered. Alternatively, and without limitation, the base body 31 may be made from any of the following materials: a glass material (such as silicate glass, or a material whose main component is not silicate and in which a glass transition phenomenon occurs due to increase of temperature); a quartz material (such as AT-cut quartz crystal); and a glass-epoxy resin. Preferably, the base body 31 is made of a heat-resistant material. The base body 31 may include a single layer or multiple layers. If the base body 31 includes multiple layers, the base body 31 includes an insulating layer formed as an outermost layer on the first main surface 32a.

The base member 30 includes electrode pads 33a and 33b disposed on the first main surface 32a, and outer electrodes 35a, 35b, 35c, and 35d disposed on the second main surface. The electrode pads 33a and 33b are terminals for electrical connection with the base member 30. The outer electrodes 35a, 35b, 35c, and 35d are terminals for electrical connection with a mounting board (not shown). The electrode pad 33a is electrically connected to the outer electrode 35a via a via-electrode 34a extending in the thickness direction. The electrode pad 33b is electrically connected to the outer electrode 35b via a via-electrode 34b extending in the thickness direction. The via-electrodes 34a and 34b are formed in via-holes that extend through the base body 31 in the thickness direction.

The electrode pads 33a and 33b are disposed on the first main surface 32a near a short side of the base member 30 on the negative X side. The electrode pads 33a and 33b are disposed separated from the short side of the base member 30 and arranged in the short-side direction. The electrode pad 33a is connected to the connection electrode 16a of the quartz crystal resonator 10 via the electroconductive holding member 36a. The electrode pad 33b is connected to the connection electrode 16b of the quartz crystal resonator 10 via the electroconductive holding member 36b.

The plurality of outer electrodes 35a, 35b, 35c, and 35d are preferably respectively disposed near the corners of the second main surface 32b. In the example illustrated in FIG. 1, the outer electrodes 35a and 35b are disposed directly below the electrode pads 33a and 33b. Thus, the via-electrodes 34a and 34b, which extend in the Y'-axis direction, can electrically connect the outer electrodes 35a and 35b to the electrode pads 33a and 33b. In the example illustrated in FIG. 1, among the four outer electrodes 35a to 35d, the outer electrodes 35a and 35b, which are disposed near a short side of the base member 30 on the negative X side are input-output electrodes to which input-output signals of the quartz crystal resonator 10 are supplied. The outer electrodes 35c and 35d, which are disposed near a short side on the positive X side of the base member 30, are dummy electrodes to which input-output signals of the quartz crystal resonator 10 are not supplied. To the dummy electrodes, input-output signals of other electronic devices on a mounting board (not shown), on which the quartz crystal resonator unit 1 is mounted, are not supplied. Alternatively, the outer electrodes 35c and 35d may be ground electrodes to which a ground potential is supplied. As illustrated in FIG. 2, if the lid member 20 is made of an electroconductive material, the shielding function of the lid member 20 can be reinforced by connecting the lid member 20 to the outer electrode 35c, which is a ground electrode.

A sealing frame 37 (FIGS. 2 and 3) is disposed on the first main surface 32a of the base body 31. The sealing frame 37 has a rectangular frame-like shape when seen in a plan view in a direction normal to the first main surface 32a. The electrode pads 33a and 33b are disposed inside of the sealing frame 37. The sealing frame 37 is made of an electroconductive material. A joining member 40 described below is disposed on the sealing frame 37, and thereby the lid member 20 is joined to the base member 30 via the joining member 40 and the sealing frame 37.

The base member 30 according to the present embodiment includes protruding portions 38 and 39 (FIG. 1) disposed on the first main surface 32a of the on the base body 31. The protruding portions 38 and 39 each have preferably a columnar shape extending in a direction normal to the first main surface 32a of the base body 31. For example, the protruding portions 38 and 39 each have a tapered surface whose diameter at an end thereof is smaller than the diameter at a base thereof. Alternatively, the protruding portions 38 and 39 each may have the same diameter at the end and at the base. The protruding portions 38 and 39 restrict movement of the lid member 20 when the base member 30 is seen in a plan view in a direction normal to the first main surface 12a.

The protruding portions 38 and 39 are disposed on the first main surface 32a so as to be in contact with the sealing frame 37. The protruding portions 38 and 39 are made of an electroconductive material and is electrically connected to the sealing frame 37. In the example illustrated in FIG. 3, the protruding portions 38 and 39 are disposed at two opposite corners of the sealing frame 37 on the first main surface 32a. When seen in a plan view in a direction normal to the first main surface 32a, the protruding portions 38 and 39 are disposed in such a way that outer edges thereof are located inside of an inner peripheral edge of the sealing frame 37a, which has a rectangular frame-like shape. By disposing the protruding portions 38 and 39 near the two opposite corners of the sealing frame 37, the protruding portions 38 and 39 can support the two opposite corners of the lid member 20.

The protruding portion 38 and the protruding portion 39 are electrically connected to the outer electrode 35c. In the example illustrated in FIG. 3, the protruding portion 38 is electrically connected to the outer electrode 35c through a via-electrode 43, the sealing frame 37, the joining member 40, and a via-electrode 44. Alternatively, as illustrated in FIG. 3, the protruding portion 38 may be electrically connected to the via-electrode 43, which extends in the Y'-axis direction, and the via-electrode 43 may be electrically connected to an inner wiring 45 extending in a direction parallel to the first main surface 32a in an intermediate layer of the base body 31. The via-electrode 43 is formed by filling a recessed portion 41, which has an opening in the first main surface 32a, with an electroconductive material. The protruding portion 39 is electrically connected to the outer electrode 35c via the via-electrode 44 extending in the Y'-axis direction. The via-electrode 44 is formed by filling a hole 42, which extends through the base body 31 from the first main surface 32a to the second main surface 32b, with an electroconductive material. The outer electrode 35d is a dummy electrode.

The electrode pads 33a and 33b of the base member 30, the outer electrodes 35a to 35d, the sealing frame 37, and the protruding portions 38 and 39 are each composed of metal films. For example, the electrode pads 33a and 33b and the outer electrodes 35a to 35d may be formed by stacking a molybdenum (Mo) layer, a nickel (Ni) layer, and a gold (Au) layer, in order from a lower layer to an upper layer. The sealing frame 37 and the protruding portions 38 and 39 are each composed of a molybdenum (Mo) layer. Alternatively, the sealing frame 37 and the protruding portions 38 and 39 may each formed by stacking a gold (Au) layer on a molybdenum (Mo) layer. In this case, the molybdenum (Mo) layer may be formed by screen printing, and the gold (Au) layer may be formed by plating. By forming the gold (Au) layer, hermeticity and joining strength can be further improved, as will be described below in Examples. A (Ni) layer may be interposed between the molybdenum (Mo) layer and the gold (Au) layer. The via-electrodes 34a and 34b and the via-electrodes 43 and 44 can be formed by filling via holes or recessed portions in the base body 31 with a metal material such as molybdenum.

The protruding portion 38 is disposed on the via-electrode 43, and the protruding portion 39 is disposed on the via-electrode 44. The protruding portions 38 and 39 and the via-electrodes 43 and 44 are each composed of, for example, the same electroconductive material, such as molybdenum. For example, the protruding portions 38 and 39 and the via-electrodes 43 and 44 are made of a second sintered material whose sintering shrinkage ratio is smaller than that of the first sintered material of the base body 31. In this case, by sintering the base member 30, due to the difference in sintering shrinkage ratio between these, at least the upper surfaces of the via-electrodes 43 and 44 bulge, and the protruding portions 38 and 39 can be easily formed so as to protrude from the first main surface 32a.

The positional relationship among the electrode pads 33a and 33b and the outer electrodes 35a to 35d is not limited to the example described above. For example, the electrode pad 33a may be disposed near one short side of the base member 30, and the electrode pad 33b may be disposed near the other short side of the base member 30. In such a structure, the quartz crystal resonator 10 is held by the base member 30 at end portions of the quartz crystal blank 11 respectively near the short sides.

The disposition of the outer electrodes is also not limited to the example described above. For example, two of the outer electrodes that are input-output electrodes may be disposed at diagonal positons on the second main surface 32b. Alternatively, the four outer electrodes may be disposed near the centers of the sides of the second main surface 32b, instead of the corners. The number of outer electrodes is not limited to four. For example, there may be only two outer electrodes that are input-output electrodes. The electrode pads and the outer electrodes need not be electrically connected to each other by using via-electrodes. The electrode pads and the outer electrodes may be electrically connected to each other by disposing surface wiring on the first main surface 32a or the second main surface 32b. Alternatively, the connection electrodes and the outer electrodes may be electrically connected to each other by forming the base body 31 of the base member 30 from multiple layers, extending a via-electrode to an intermediate layer, and disposing inner wiring in the intermediate layer.

As illustrated in FIG. 2, by joining the lid member 20 and the base member 30 via the sealing frame 37 and the joining member 40, the quartz crystal resonator 10 is sealed in the inner space (cavity) 26 surrounded by the lid member 20 and the base member 30. In this case, preferably, the inside of the inner space 26 is in a vacuum state in which pressure is lower than the atmospheric pressure, because the vacuum state can reduce change with time due to oxidation of the first excitation electrode 14a and the second excitation electrode 14b.

The joining member 40 is formed around the entire periphery of the lid member 20 and the base member 30. To be specific, the joining member 40 is disposed on the sealing frame 37 and the protruding portions 38 and 39. The joining member 40 covers the protruding portions 38 and 39.

Because the sealing frame 37 and the joining member 40 are interposed between the facing surface 23 of the side wall 22 of the lid member 20 and the first main surface 32a of the base member 30, the quartz crystal resonator 10 is sealed by the lid member 20 and the base member 30. In this state, parts of the joining member 40 that cover the protruding portions 38 and 39 are in contact with the side wall 22 of the lid member 20. Thus, the protruding portions 38 and 39 can restrain movement of the lid member 20.

The joining member 40 is, for example, a brazing member. The joining member 40 is preferably made of a gold-tin (Au—Sn) eutectic alloy. Thus, the lid member 20 and the base member 30 are metallically joined. With metallic joining, salability can be improved.

The joining member 40 may be formed from one material layer such as brazing member (for example, gold-tin (Au—Sn) eutectic alloy), or may be formed from two or more material layers.

The joining member 40 is not limited to an electroconductive material. For example, the joining member 40 may be a glass adhesive, such as low-melting-point glass (for example, lead borate glass, tin phosphate glass, or the like) or a resin adhesive. In this case, the joining member 40 can be formed at lower costs than metallic joining, heating temperature can be reduced, and the manufacturing process can be simplified.

In the example illustrated in FIG. 2, parts of the joining member 40 that cover the protruding portions 38 and 39 are in contact with the side wall 22 on the inner surface 24 side of the lid member 20. Thus, the protruding portions 38 and 39 can easily and effectively restrain movement of the lid member 20.

In the quartz crystal resonator 10 according to the present embodiment, one end of the quartz crystal blank 11 in the long-side direction (end portion on a side on which the electroconductive holding members 36a and 36b are disposed) is a fixed end, and the other end is a free end. The quartz crystal resonator 10, the lid member 20, and the base member 30 each have a rectangular shape as viewed in the XZ'-plane, and have the same long-side direction and the short-side direction.

The position of the fixed end of the quartz crystal resonator 10 is not particularly limited. For example, the quartz crystal resonator 10 may be fixed to the base member 30 at both ends of the quartz crystal blank 11 in the long-side direction. In this case, electrodes of the quartz crystal resonator 10 and the base member 30 may be formed in such a way that the quartz crystal resonator 10 is fixed at both ends of the quartz crystal blank 11 in the long-side direction.

In the quartz crystal resonator unit 1 according to the present embodiment, an alternating electric field is applied between the pair of first and second excitation electrodes 14a and 14b of the quartz crystal resonator 10 via the outer electrodes 35a and 35b of the base member 30. Thus, the vibration portion 17 of the quartz crystal blank 11 vibrates in a predetermined vibration mode such as a thickness shear mode, and resonance characteristics can be obtained in accordance with the vibration.

With the present embodiment, parts of the joining member 40 that cover the protruding portions 38 and 39 are in contact with the side wall 22 of the lid member 20 so as to restrain movement of the lid member 20 when seen in a plan view in a direction normal to the first main surface 32a of the base member 30. Thus, because the joining member 40, which covers protruding portions 38 and 39, is in contact with the side wall 22 of the lid member 20, joining strength can be improved. Moreover, because occurrence of displacement of the lid member 20 can be suppressed, the hermeticity of the quartz crystal resonator 10 can be improved.

Figure 4:
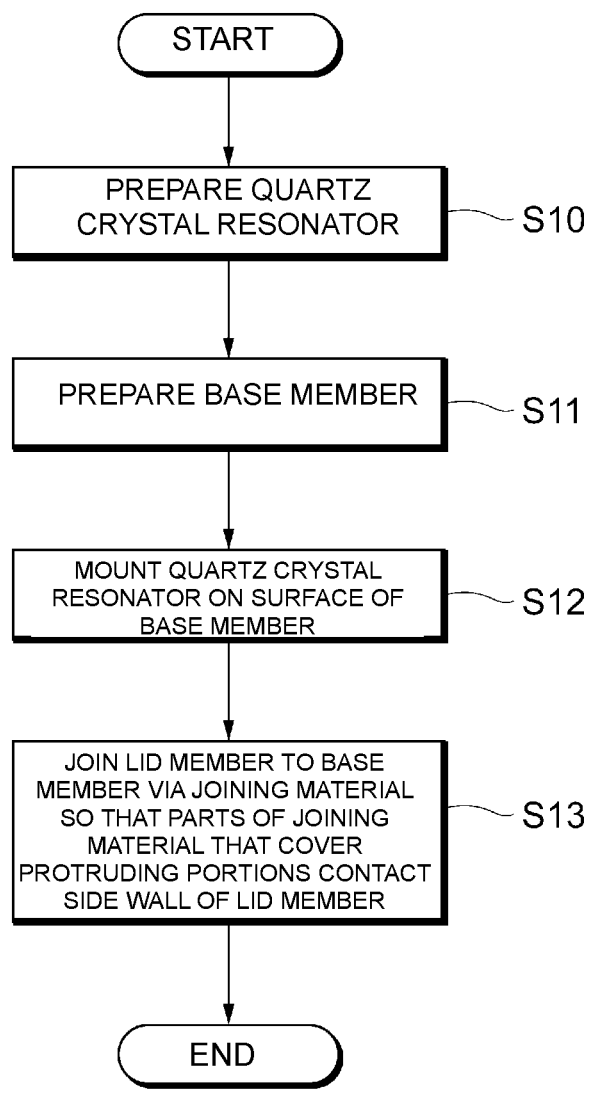
FIG. 4 is a flowchart of a method of manufacturing a quartz crystal resonator unit according to a first embodiment of the present invention.
Figure 5:
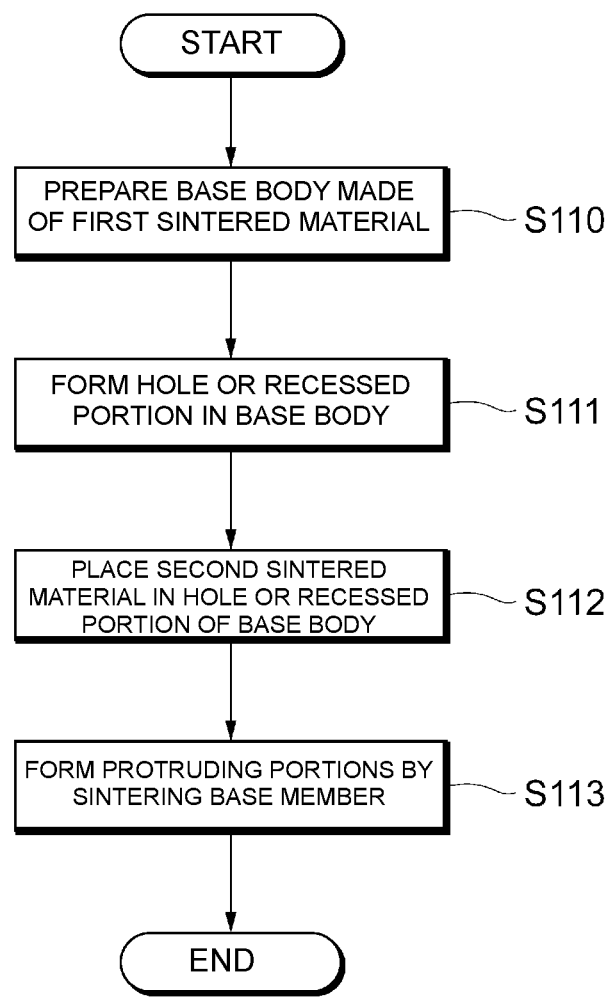
FIG. 5 is a flowchart of details of step S11 shown in FIG. 4.

Next, referring to FIGS. 4 and 5, a method of manufacturing a quartz crystal resonator unit according to a first embodiment of the present invention will be described. FIG. 4 is a flowchart of a method of manufacturing the quartz crystal resonator unit 1. FIG. 5 is a flowchart of details of a step (S11) of preparing the base member 30 shown in FIG. 4.

In the present embodiment, as illustrated in FIG. 4, first, the quartz crystal resonator 10 is prepared (S10). Descriptions of a step of processing the quartz crystal blank and a step for forming various electrodes, which are general, will be omitted. The structure of the quartz crystal resonator 10 is as described above.

Next, the base member 30 is prepared (S11). To be specific, as illustrated in FIG. 5, the base body 31, which is made of a first sintered material, is prepared (S110). The first sintered material is, for example, an insulating ceramic such as alumina.

Next, the recessed portion 41 and the hole 42 are formed in the base body 31 by etching or the like (S111), and a second sintered material is placed in the recessed portion 41 and the hole 42 (S112). The second sintered material can be disposed by, for example, screen-printing a molybdenum material. For example, the recessed portion 41 and the hole 42 can be filled with second sintered material by applying the second sintered material onto the base body 31 and by levelling the applied second sintered material by using a squeegee.

Subsequently, the protruding portions 38 and 39 are formed by sintering the base member 30 (S113). In the present embodiment, the sintering shrinkage ratio of the first sintered material, which is the base body 31, is smaller than the sintering shrinkage ratio of the second sintered material disposed in the recessed portion 41 and the hole 42. Therefore, by performing sintering, the second sintered material protrudes outward from the inside of the openings of the recessed portion 41 and the hole 42. Thus, with the second sintered material disposed in the recessed portion 41, an upper surface of the via-electrode 43 bulges, and the protruding portion 38 is formed so as to protrude on the via-electrode 43. Likewise, with the second sintered material disposed in the hole 42, an upper surface of the via-electrode 44 bulges, and the protruding portion 39 is formed so as to protrude on the via-electrode 44.

In the steps S111 to S113, in addition, various electrodes, including the electrode pads 33a and 33b, the via-electrodes 34a and 34b, the outer electrodes 35a to 35d, and the sealing frame 37, can be formed. Thus, the base member 30 illustrated in FIG. 1 can be prepared.

Next, referring back to FIG. 4, the quartz crystal resonator 10 is mounted on the first main surface 32a of the base body 31 of the base member 30 (S12). To be specific, an electroconductive adhesive is applied onto the electrode pads 33a and 33b on the first main surface 32a of the base body 31, and the electroconductive adhesive is thermally cured in the state in which the quartz crystal resonator 10 is mounted thereon. Thus, by using the electroconductive holding members 36a and 36b, which are formed by thermally curing the electroconductive adhesive, the connection electrodes 16a and 16b of the quartz crystal resonator 10 and the electrode pads 33a and 33b of the base member 30 are electrically connected. Moreover, by using the electroconductive holding members 36a and 36b, a quartz crystal resonator 70 can be excitably held. The quartz crystal resonator 10 is mounted on the first main surface 32a in such a way that the second excitation electrode 14b faces the base member 30.

Lastly, the lid member 20 is joined to the base member 30 via the joining member 40 (S13). At this time, parts of the joining member 40 that cover the protruding portions 38 and 39 are brought into contact with the side wall 22 of the lid member 20. In the step S13, for example, the joining member 40 may be disposed on the sealing frame 37 and the protruding portions 38 and 39 so as to cover these, and, subsequently, the lid member 20 may be joined to the base member 30.

Next, the results of an experiment performed on samples of the quartz crystal resonator unit 1 according to the present embodiment will be described.

Example 1

Regarding quartz crystal resonator units manufactured under the following manufacturing conditions, joining strength was measured for each of a sample A, with protrusions according to the present embodiment, and a sample B, without protrusions according to a comparative example. As a result, it was found that the sample A, with protrusions, was superior to sample B in joining strength.

(Manufacturing Conditions)

Conditions common to samples A and B were as follows. That is, each sample was a hermetically sealed quartz crystal resonator unit having an outer dimension of 1.2 mm×1.0 mm (long-side direction×short-side direction). The quartz crystal resonator unit included a quartz crystal blank; a base member on which the quartz crystal blank was mounted, that had a thickness of 0.125 mm, and that was made of alumina; and a lid member that was a metal cap having a recessed shape. The joining member was a Au—Sn alloy, and the quadrangular sealing frame was formed to have a width of 0.1 mm in order to obtain a hermetically sealed structure. The metal cap having a recessed shape was formed to have an outer dimension of 1.2 mm×1.0 mm×0.16 mm (long-side direction×short-side direction×height), and the thickness of each of the top panel 21 and the side wall 22 was 0.06 mm. The sealing frame and the protruding portions were heated at 320° C. together with the joining member, and thereby the lid member was thermally joined to the base member.

In the sample A with protrusions, protruding portions were formed by forming via-electrodes (molybdenum), each having a diameter ϕ0.06 mm, in the base member at two diagonal corners of the sealing frame, and by causing the via-electrodes to bulge. The height of the protruding portions was higher than the height of the sealing frame, which was 0.02 mm, by 0.01 mm. The protruding portions were formed from molybdenum (Mo), which was the same as the material of the sealing frame and the via-electrodes.

(Test Method)

Measurement was performed in accordance with "Test Ue3: Adhesion (Shear Strength) Test" defined in "JIBS C 60068-2-21 (2009)".

(Test Results)

As can be seen from below, the sample A (with protrusions) was superior to the sample B (without protrusions) in joining strength.

TABLE 1

|  | With Protrusions | Without Protrusions |
| --- | --- | --- |
| 1 | 42.64N | 33.33N |
| 2 | 42.89N | 32.63N |
| 3 | 44.40N | 31.87N |
| 4 | 44.51N | 27.19N |
| 5 | 49.10N | 36.32N |
| Average | 44.71N | 31.67N |
| Deviation | 2.60N | 3.33N |
| Maximum | 49.10N | 36.32N |
| Minimum | 42.64N | 27.19N |

Example 2

Regarding quartz crystal resonator units manufactured under the following manufacturing conditions, joining strength and leakage tests were performed on each of a sample C, which was an example according to the present embodiment, and a sample D, which was another example according to the present embodiment. As a result, it was found that the sample C was superior to the sample D in joining strength and leakage test.

(Manufacturing Conditions)

Conditions common to sample C and D were as follows. That is, each sample was a hermetically sealed quartz crystal resonator unit having an outer dimension of 1.2 mm×1.0 mm (long-side direction×short-side direction). The quartz crystal resonator unit included a quartz crystal blank; a base member on which the quartz crystal blank was mounted, that had a thickness of 0.125 mm, and that was made of alumina; and a lid member that was a metal cap having a recessed shape. The quadrangular sealing frame was formed to have a width of 0.1 mm in order to obtain a hermetically sealed structure. The metal cap having a recessed shape was formed to have an outer dimension of 1.2 mm×1.0 mm×0.16 mm (long-side direction×short-side direction×height), and a thickness of each of the top panel and the side wall of the metal cap having a recessed shape was 0.06 mm. The sealing frame and the protruding portions were heated at 320° C. together with the joining member, which was an An—Sn alloy, and thereby the lid member was thermally joined to the base member.

In the sample C, protruding portions were formed by forming via-electrodes (Mo), each having a diameter ϕ0.06 mm, in the base member at two diagonal corners of the sealing frame, and by causing the via-electrodes to bulge. In the sample C, the sealing frame of molybdenum was formed in a region in which the ends (tips) of the protruding portions were not present, and a Au plating layer of 0.2 μm was formed in a region including the ends of the protruding portions. The Au plating layer was formed integrally on the ends the protruding portions and the sealing frame. In the sample C, a Au—Sn alloy was formed on the protruding portions and the sealing frame.

In the sample D, protruding portions were formed by stacking alumina pieces, which were made of the same material as the base member, on the surface of the base member. In the sample D, the sealing frame of molybdenum was formed in a region in which the ends (tips) of the protruding portions were not present. In sample D, a Au—Sn alloy (joining member) was formed on the protruding portions and the sealing frame.

(Test Method)

Measurement was performed in accordance with "Test Ue3: Adhesion (Shear Strength) Test" defined in "JIBS C 60068-2-21 (2009)".

(Test Results)

As can be seen from below, the sample C (Mo) was superior to the sample D (alumina) in joining strength. That is, it can be seen that the joining strength of the sample C, in which a Au plating layer was formed at the ends of the protruding portions, was higher than that of the sample D by 3N on average, and deviation was smaller than that of sample D by about 1 N.

TABLE 2

| Protrusion Material | Mo | Alumina |
| --- | --- | --- |
| 1 | 41.27N | 43.48N |
| 2 | 44.88N | 36.51N |
| 3 | 48.51N | 43.60N |
| 4 | 44.56N | 46.18N |
| 5 | 44.99N | 39.90N |
| Average | 44.84N | 41.93N |
| Deviation | 2.56N | 3.77N |
| Maximum | 48.51N | 46.18N |
| Minimum | 41.27N | 36.51N |

A leak test was performed on the sample C (Mo) and the sample D (alumina). As shown below, it was found that occurrence of hermeticity defect was suppressed in the sample C compared with the sample D. It is supposed that occurrence of hermeticity defect was suppressed in the sample C because the ends of the protruding portions, which were exposed from the sealing frame, were covered with a Au plating layer, and this was integrated with and continuous with a Au plating layer on the sealing frame.

TABLE 3

| Protrusion Material | Processed Number | Hermeticity Defect | Percent Defective |
| --- | --- | --- | --- |
| Mo | 6,720 | 0 | 0.00% |
| Alumina | 6,720 | 98 | 1.46% |

Second Embodiment

Figure 6:
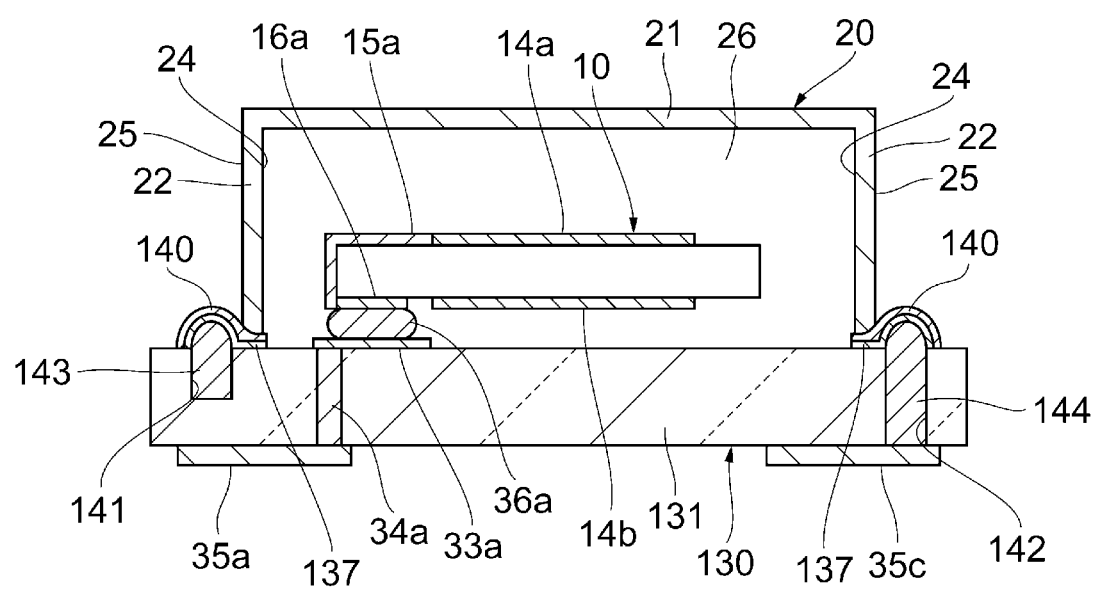
FIG. 6 is a sectional view of a quartz crystal resonator unit according to a second embodiment of the present invention.

Next, referring to FIG. 6, a quartz crystal resonator unit 2 according to a second embodiment of the present invention will be described. FIG. 6 is a sectional view of a quartz crystal resonator unit 2 according to the present embodiment. FIG. 6 is a sectional view taken along the same line as in FIG. 2. Elements that are the same as those of the first embodiment are denoted by the same numerals. Differences from the first embodiment will be described below.

The quartz crystal resonator unit 2 according to the present embodiment includes a base member 130, and the structure of the base member 130 differs from the first embodiment. To be specific, as illustrated in FIG. 6, the base member 130 includes protruding portions 138 and 139 and a joining member 140; and parts of the joining member 140 that cover the protruding portions 138 and 139 are in contact with the side wall 22 on the outer surface 25 side of the lid member 20. In this case, when seen in a plan view in a direction normal to the first main surface 32a, the protruding portions 138 and 139 are disposed in such a way that outer edges thereof are located outside of an outer peripheral edge of a sealing frame 137, which has a rectangular frame-like shape.

As in the first embodiment, the protruding portion 138 is disposed on the via-electrode 43 formed in a recessed portion 141 of a base body 131, and the protruding portion 139 is disposed on a via-electrode 144 formed in a hole 142 of the base body 131.

In the present embodiment, parts of the joining member 140 that cover the protruding portions 138 and 139 can restrain movement of the lid member 20 from the outer surface 25 side of the lid member 20. Accordingly, also in the present embodiment, positioning accuracy, joining strength, and hermeticity can be improved.

<Modifications>

The present invention is not limited to the embodiments described above, and may be applied to various modifications.

By way of example, in the first embodiment, the number of protruding portions is two. However, in the present invention, the number of protruding portions may be two or more. For example, three protruding portions may be formed so as to support three of the four corners of a rectangular lid member, or four protruding portions may be formed so as to support the four corners of a rectangular lid member. Protruding portions need not be formed on via-electrodes, and via-electrodes need not be formed directly below protruding portions. A method of forming protruding portions need not be a method that uses a difference in sintering shrinkage ratio. For example, protruding portions may be formed by stacking material pieces on a base member.

In the first embodiment, the quartz crystal blank has a flat plate-like shape. However, the present invention is not limited to this. A mesa structure in which a vibration portion including the center of a main surface is thicker than the surrounding portion may be used, or an inverted mesa structure in which the vibration portion is thinner than the surrounding portion may be used. Alternatively, the present invention may be applied to a convex shape or a beveled shape in which the thicknesses (steps) of the excitation portion and the peripheral portion continuously change. Further alternatively, a quartz crystal resonator may be a tuning-fork-type quartz crystal resonator that includes: a base material that is a quartz crystal plate that is cut at a predetermined angle with respect to the X-axis, Y-axis, and Z-axis, which are crystallographic axes of a quartz crystal and which are perpendicular to each other; a quartz crystal blank including a base portion and one or more vibration arms that extend from the base portion; and excitation electrodes that are disposed on the vibration arms to cause bending vibration.

The cut angle of a quartz crystal blank may be a cut that is not an AT cut (such as a BT cut).

The embodiments, which have been described above in order to facilitate understanding the present invention, do not limit the scope of the present invention. The present invention may be modified within the spirit and scope thereof and includes the equivalents thereof. That is, a modification of each of the embodiments that is appropriately modified in design by a person having ordinary skill in the art is included in the scope of the present invention as long as the modification has the features of the present invention. For example, elements included in each of the embodiments; and the dispositions, the materials, the shapes, and the sizes of the elements are not limited to those described above as examples and may be modified as appropriate. Elements included in each of the embodiments may be used in a combination as long as the combination is technologically feasible, and such combination is also included in the scope of the present invention as long as the combination has the features of the present invention.

REFERENCE SIGNS LIST 1 quartz crystal resonator unit
2 quartz crystal resonator unit
10 quartz crystal resonator
11 quartz crystal blank
12a, 12b main surface
14a, 14b excitation electrode
15a, 15b extension electrode
16a, 16b connection electrode
20 lid member
22 side wall
24 inner surface
25 outer surface
30 base member
33a, 33b electrode pad
35a, 35b, 35c, 35d outer electrode
41 recessed portion
42 hole
40 joining member
43, 44 via-electrode

The invention claimed is:

1. A quartz crystal resonator unit comprising:
a base member including a surface and two protruding portions on the surface, at least one of the two protruding portions extending into the base member;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the two protruding portions, the lid member and the base member defining an inner space that accommodates the quartz crystal resonator, at least parts of the joining member that cover at least a portion of the two protruding portions are in contact with the side wall of the lid member so as to restrain movement of the lid member when seen in a plan view in a direction normal to the surface of the base member;
wherein:
the base member includes a base body formed of a first sintered material; and
the two protruding portions are formed of a second sintered material whose sintering shrinkage ratio is smaller than a sintering shrinkage ratio of the base body.

2. A quartz crystal resonator unit comprising:
a base member including an upper surface and first and second protruding portions extending upwardly from the upper surface, at least one of the first and second protruding portions extending into the base member;
a quartz crystal resonator mounted on the upper surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form an open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

3. The quartz crystal resonator unit according to claim 2, wherein:
the lid member has a rectangular shape when seen in a plan view in the direction normal to the upper surface of the base member; and
the first and second protruding portions are disposed so as to correspond to two opposite corners of the rectangular shape of the lid member.

4. The quartz crystal resonator unit according to claim 2, wherein:
the base member includes a base body formed of a first sintered material; and
the first and second protruding portions are formed of a second sintered material whose sintering shrinkage ratio is smaller than a sintering shrinkage ratio of the base body.

5. The quartz crystal resonator unit according to claim 2, wherein the first and second protruding portions are disposed on via-electrodes of the base member.

6. The quartz crystal resonator unit according to claim 2, wherein:
the base member includes an outer electrode; and
the first and second protruding portions are made of an electroconductive material and are electrically connected to the outer electrode.

7. The quartz crystal resonator unit according to claim 2, wherein the joining member is also located in a gap between the innermost bottom edge of the side wall and the upper surface of the base member.

8. A method of manufacturing a quartz crystal resonator unit, the method comprising:
mounting a quartz crystal resonator on an upper surface of a base member, the base member including first and second protruding portions extending upwardly from the upper surface, at least one of the first and second protruding portions extending into the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and joining a lid member to the base member such that the quartz crystal resonator is housed in an open space defined by the lid member and the upper surface of the base member, the lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form the open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

9. The method of manufacturing the quartz crystal resonator unit according to claim 8, wherein
the base member includes a base body formed of a first material having a first shrinkage ratio and the method further comprises:
forming a pair of holes and/or recessed portions in the base body;
placing a second material having a second shrinkage ratio that is smaller than the first shrinkage ratio in the pair of holes and/or recessed portions; and
forming the first and second protruding portions from the second material by sintering the base member with the second material located in the pair of holes and/or recessed portions.

10. The method of manufacturing the quartz crystal resonator unit according to claim 8, wherein:
the lid member has a rectangular shape when seen in a plan view in the direction normal to the upper surface of the base member; and
the first and second protruding portions are disposed so as to correspond to two opposite corners of the rectangular shape of the lid member.

11. The method of manufacturing the quartz crystal resonator unit according to claim 8, wherein:
the base member includes a base body formed of a first material having a first sintering shrinkage ratio; and
the first and second protruding portions are formed of a second material having a second shrinkage ratio which is smaller than the first sintering shrinkage ratio.

12. The method of manufacturing the quartz crystal resonator unit according to claim 8, wherein the first and second protruding portions are disposed on via-electrodes of the base member.

13. The method of manufacturing the quartz crystal resonator unit according to claim 8, wherein:
the base member includes an outer electrode; and
the first and second protruding portions are made of an electroconductive material and are electrically connected to the outer electrode.

14. The method of manufacturing the quartz crystal resonator unit according to claim 8, wherein the joining member is also located in a gap between the innermost bottom edge of the side wall and the upper surface of the base member.

15. A quartz crystal resonator unit, comprising:
a base member including a surface and two protruding portions on the surface;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the two protruding portions, the lid member and the base member defining an inner space that accommodates the quartz crystal resonator, at least parts of the joining member that cover at least a portion of the two protruding portions are in contact with the side wall of the lid member so as to restrain movement of the lid member when seen in a plan view in a direction normal to the surface of the base member;
wherein the two protruding portions are disposed on via-electrodes of the base member.

16. A quartz crystal resonator unit, comprising:
a base member including a surface and two protruding portions on the surface;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the two protruding portions, the lid member and the base member defining an inner space that accommodates the quartz crystal resonator, at least parts of the joining member that cover at least a portion of the two protruding portions are in contact with the side wall of the lid member so as to restrain movement of the lid member when seen in a plan view in a direction normal to the surface of the base member;
wherein:
the base member includes an outer electrode; and
the two protruding portions are made of an electroconductive material and are electrically connected to the outer electrode.

17. A method of manufacturing a quartz crystal resonator unit, the method comprising:
(a) forming a base body having an upper surface and first and second protruding portions extending upward from the upper surface by, at least:
(i) placing a first material in a pair of holes and/or recessed portions located in a base body which is formed of a second material, the first material having a smaller sintering shrinkage ratio that the second material; and (ii) sintering the base body with the first material located in the pair of holes and/or recessed portions to cause the first material to project upwardly from the base body and form the first and second protruding portions;

(b) mounting a quartz crystal resonator on the upper surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and (c) joining a lid member to the base member such that the quartz crystal resonator is housed in an open space defined by the lid member and the upper surface of the base member, the lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form the open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

18. A quartz crystal resonator unit comprising:
a base member including a surface and two protruding portions on the surface, at least one of the two protruding portions comprises a distal end of a via electrode extending through the base member;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the two protruding portions, the lid member and the base member defining an inner space that accommodates the quartz crystal resonator, at least parts of the joining member that cover at least a portion of the two protruding portions being in contact with the side wall of the lid member so as to restrain movement of the lid member when seen in a plan view in a direction normal to the surface of the base member;
wherein:
the base member includes a base body that is a first sintered material; and
the two protruding portions are made of a second sintered material whose sintering shrinkage ratio is smaller than a sintering shrinkage ratio of the base body.

19. A quartz crystal resonator unit comprising:
a base member including a surface and two protruding portions on the surface, at least one of the two protruding portions is electrically coupled to an outer electrode formed on the base member;
a quartz crystal resonator mounted on the surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends toward the surface of the base member, the lid member being joined to the surface of the base member via a joining member which covers at least the two protruding portions, the lid member and the base member defining an inner space that accommodates the quartz crystal resonator, at least parts of the joining member that cover at least a portion of the two protruding portions are in contact with the side wall of the lid member so as to restrain movement of the lid member when seen in a plan view in a direction normal to the surface of the base member;
wherein:
the base member includes a base body that is a first sintered material; and
the two protruding portions are made of a second sintered material whose sintering shrinkage ratio is smaller than a sintering shrinkage ratio of the base body.

20. A quartz crystal resonator unit comprising:
a base member including an upper surface and first and second protruding portions extending upwardly from the upper surface, at least one of the first and second protruding portions comprises a distal end of a via electrode extending through the base member;
a quartz crystal resonator mounted on the upper surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form an open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

21. A quartz crystal resonator unit comprising:
a base member including an upper surface and first and second protruding portions extending upwardly from the upper surface, at least one of the first and second protruding portions being electrically coupled to an outer electrode formed on the base member;
a quartz crystal resonator mounted on the upper surface of the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
a lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form an open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

22. A method of manufacturing a quartz crystal resonator unit, the method comprising:
mounting a quartz crystal resonator on an upper surface of a base member, the base member including first and second protruding portions extending upwardly from the upper surface, at least one of the first and second protruding portions comprises a distal end of a via electrode extending through the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
joining a lid member to the base member such that the quartz crystal resonator is housed in an open space defined by the lid member and the upper surface of the base member, the lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form the open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

23. A method of manufacturing a quartz crystal resonator unit, the method comprising:
mounting a quartz crystal resonator on an upper surface of a base member, the base member including first and second protruding portions extending upwardly from the upper surface, at least one of the first and second protruding portions being electrically coupled to an outer electrode formed on the base member, the quartz crystal resonator including a quartz crystal blank, a pair of excitation electrodes that are disposed on opposed main surfaces of the quartz crystal blank so as to face each other with the quartz crystal blank located there between, and a pair of connection electrodes disposed on the quartz crystal blank and electrically connected to respective ones of the pair of excitation electrodes; and
joining a lid member to the base member such that the quartz crystal resonator is housed in an open space defined by the lid member and the upper surface of the base member, the lid member having a side wall that extends downwardly toward the upper surface of the base member, the side wall having bottom, inner and outer surfaces, the inner surface having a radially innermost bottom edge that faces the upper surface of the base member, the lid member being joined to the base member by a joining member to form the open space that houses the quartz crystal resonator, the first and second protruding portions extending upwardly above the radially innermost bottom edge of the side wall and being separated from first and second portions of the inner surface of the side wall by first and second gaps, respectively, the first and second protruding portions not extending under the bottom surface of the side wall, the joining member extending into the first and second gaps and adhering the first and second protruding portions to the inner surface of the side wall, such that the first and second protruding portions restrain lateral movement of the lid member relative to the base member.

* * * * *